United States Patent [19]
Bowers

[11] Patent Number: 5,494,451
[45] Date of Patent: Feb. 27, 1996

[54] PRINTED CIRCUIT BOARD RETAINING LATCH

[75] Inventor: Michael D. Bowers, Halifax, Pa.

[73] Assignee: The Whitaker Corporation, Wilmington, Del.

[21] Appl. No.: 200,792

[22] Filed: Feb. 23, 1994

[51] Int. Cl.⁶ ................................................ H01R 13/62
[52] U.S. Cl. ............................................ 439/328; 439/358
[58] Field of Search ........................... 439/296, 326–328, 439/358, 629–637

[56] References Cited

U.S. PATENT DOCUMENTS

| | | | |
|---|---|---|---|
| 4,008,942 | 2/1977 | Grossi. | |
| 4,017,138 | 4/1977 | Evans. | |
| 4,714,306 | 12/1987 | Miyazawa et al. | 439/395 |
| 4,725,921 | 2/1988 | Scholz | 361/392 |
| 4,872,853 | 10/1989 | Webster | 439/327 |
| 5,145,397 | 9/1992 | Yamada et al. | 439/328 |
| 5,154,627 | 10/1992 | Lee | 439/326 |
| 5,161,994 | 11/1992 | Sato et al. | 439/326 |
| 5,169,333 | 12/1992 | Yang Lee | 439/326 |
| 5,267,872 | 12/1993 | Gou et al. | 439/326 |

*Primary Examiner*—Khiem Nguyen
*Attorney, Agent, or Firm*—Bruce J. Wolstoncraft

[57] ABSTRACT

The invention herein disclosed is directed to a latch (1) for securing in place a printed circuit board (8) plugged into a connector (3). The latch (1) at one end is designed to grip the connector (3) in a connector retainer (2) and at the other end is designed to releasably grip the printed circuit board (8) in a retainer (6). The latch (1) is made to grip or release by actuating a tab (9) on the printed circuit board retainer (6) of the latch (1).

11 Claims, 4 Drawing Sheets

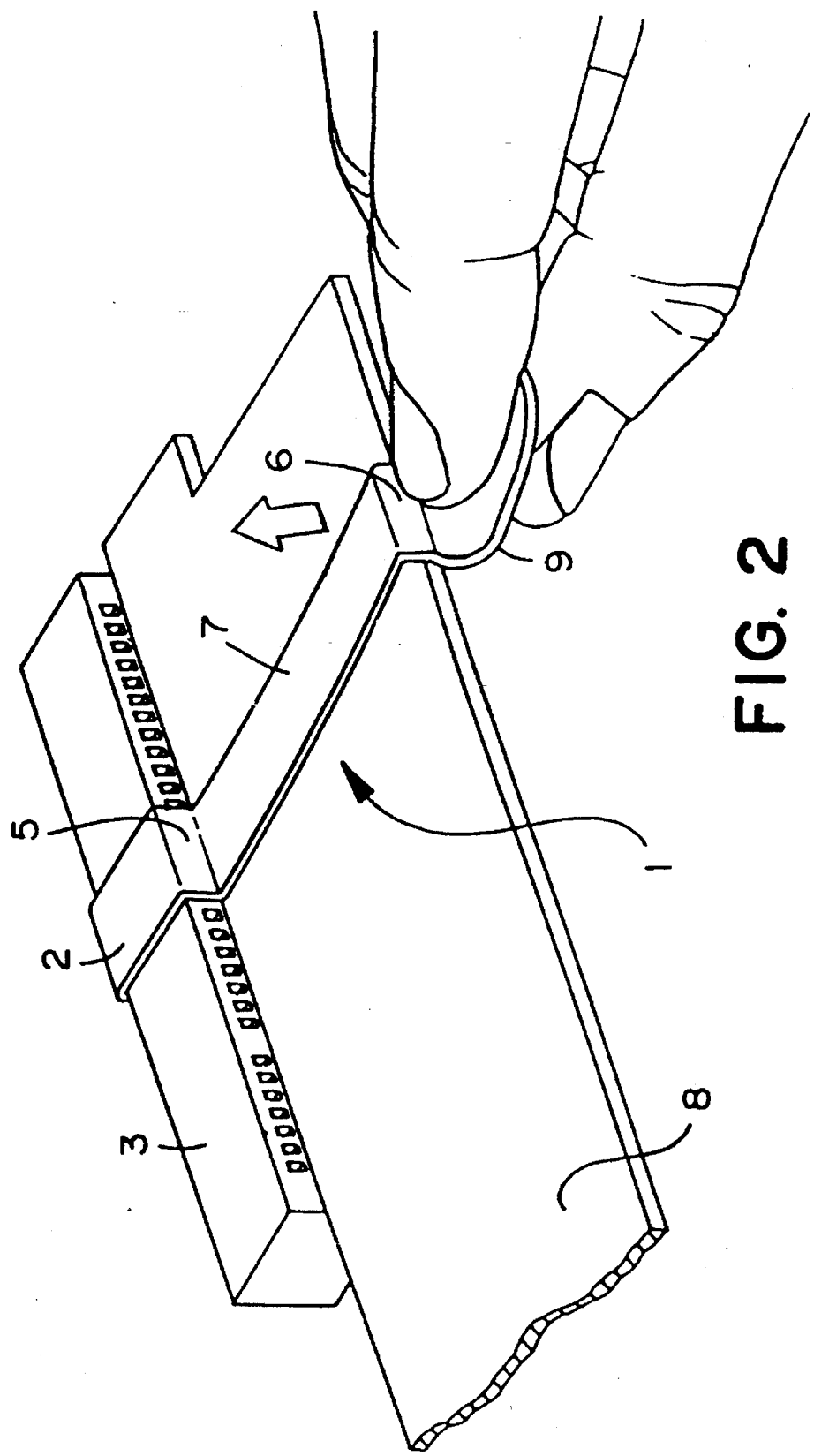

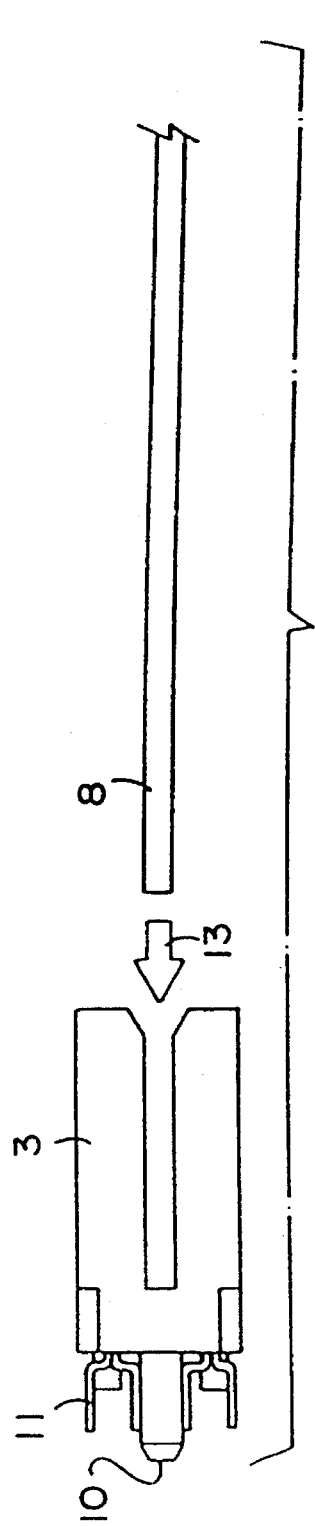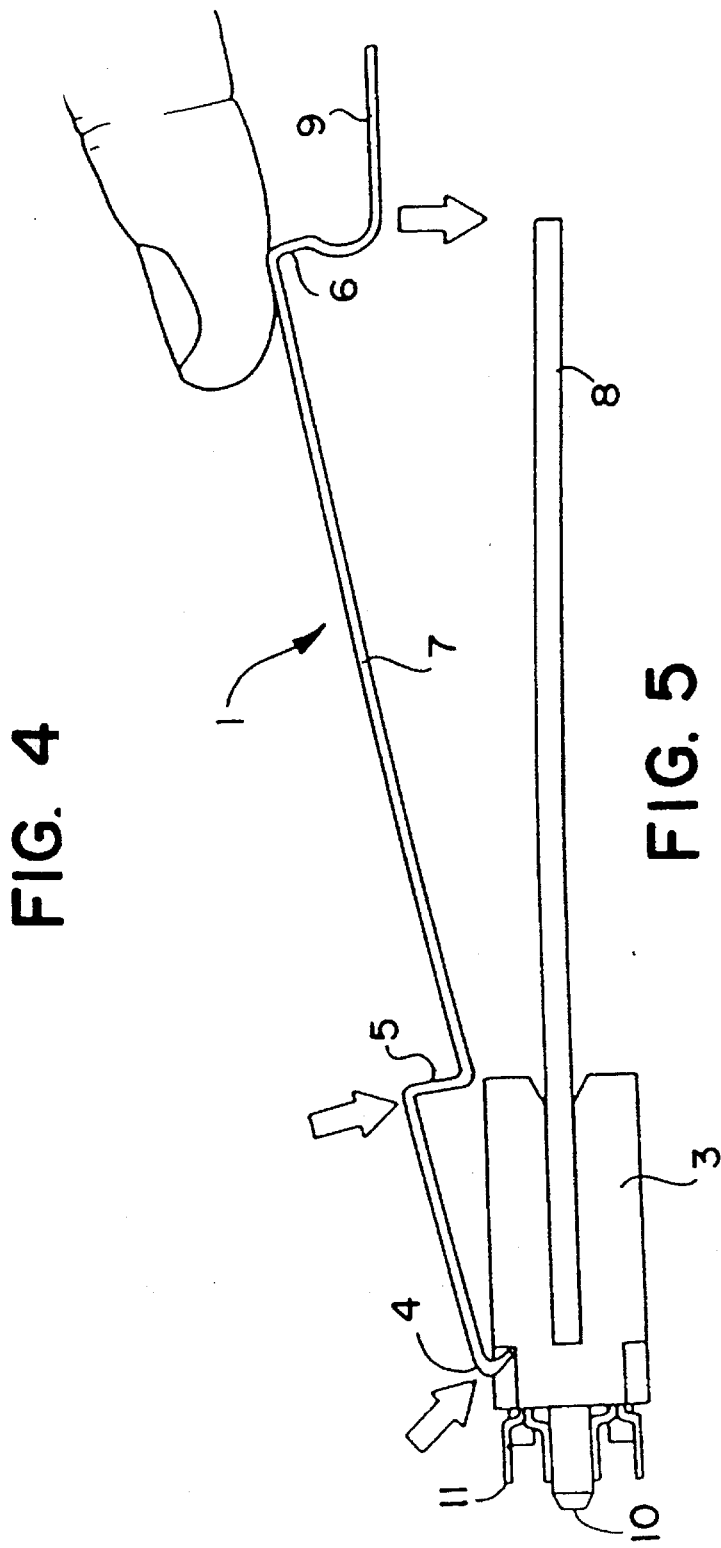

PRINTED CIRCUIT BOARD RETAINING LATCH

FIELD OF THE INVENTION

The invention relates to devices for retaining printed circuit cards in connectors in a fixed position.

BACKGROUND OF THE INVENTION

There is a need in the art to securely fix a printed circuit board when it is plugged into a connector.

Printed circuit boards ("PCB's") are widely used in a broad range of industrial, commercial and consumer products, as for example, radios, TV's VCR's watches, timers and computers. The printed circuit boards come in a wide array of sizes and shapes. In various applications, the number of circuit boards necessary for certain operations may number several dozen. Space considerations are of importance, and it is generally desirable to engineer as many circuit boards as possible in a minimum of space. In view of the fact that space is critical in the printed circuit board art, the instant invention addresses a feature of this problem.

In some product applications, the end of a printed circuit board is received within a suitable connector, and cooperating terminals or contacts provide the necessary electrical interconnection between the printed circuit board and the connector. Since the printed circuit board is plugged into the connector, it is necessary that the circuit board be securely affixed to the connector as any vibration or bumping could cause the respective contacts to separate. Any such disruption may cause a break in circuitry or a possible shorting thereof.

Various solutions have been proposed to secure the printed circuit board to the connector. For example, U.S. Pat. No. 4,008,942 to Grossi proposes a solution and method for fixing the printed circuit board to the connector which uses a spring clip and a notch-out on the printed circuit board to fix the PCB to the connector. This notching-out of the printed circuit board reduces the amount of surface space on the printed circuit board for the circuit elements or pads; hence is undesirable. Further, the device of Grossi requires equal tension on both the PCB and the connector because without equal tension, the circuit board would vibrate loose. This is a further disadvantage in the Grossi patent.

U.S. Pat. No. 4,872,853 to Webster is directed to a device for retaining a printed circuit board or card in a zero insertion force ("ZIF") edge connector. The device is a U-shaped member formed from spring wire and having legs which are bent into a concave-convex shape so that the member can be resiliently elongated. In use, the U-shaped wire member is pivotally attached and in use is forced into a notched out slot on the printed circuit card. This device of Webster's has the disadvantage of having a notch cut out on the printed circuit board which loses space for circuitry on the board; in addition, the device is complicated in construction requiring modifications on the circuit board as well as the connector to accommodate the spring latching device. Moreover, since only one spring is shown, there is the possibility that the circuit board will be held in contact in an uneven manner allowing for faulty circuit contact.

U.S. Pat. No. 4,017,138 to Evans is directed to a connector but is disadvantageous in use compared to the locking means of the invention herein described because it is complicated in construction, would be expensive to make, and would require modifications on the latching surface.

A hinged-mounted labeling panel is shown by Scholz in U.S. Pat. No. 4,725,921. This hinge-mounted labeling panel is to be used on plug-in modules and is fitted with a locking means. The device of Scholz is complicated to construct and requires a hinge arrangement and a structural modification of the subassembly which serves to mount the plug-in modules. The device of Scholz would be expensive and difficult to manufacture.

U.S. Pat. No. 5,161,994 to Sato et al is concerned with a board latching device to be used with a printed circuit board and a connector for connecting two printed circuit boards. The latching device of Sato et al requires openings in the printed circuit board with the metal latching means to be inserted into the openings therein and requires complicated fabrication in forming the latch device.

The metal latches shown by U.S. Pat. No. 5,154,627 to Lee are difficult to manufacture and require cutting and punching for their manufacture. Moreover, Lee requires two connectors for secure positioning of the boards.

OBJECTS OF THE INVENTION

A primary object of the instant invention is to produce a more efficient printed circuit board retaining device or latch.

Another object of the invention is to produce a retaining latch which will use up a minimum amount of surface area on the printed circuit board.

Still another object of the invention is to produce a latch for securing a printed circuit board to a connector which will require no modification of the printed circuit board and thus will not use up valuable surface area on the printed circuit board.

A further object of this invention is to produce a retaining latch which is simple, but yet efficient, and is economical to produce.

SUMMARY OF THE INVENTION

The invention herein described concerns a latch for securely locking in place a printed circuit board fitted into a connector, sometimes referred to as a Card Edge Connector. The latch is a single unit which is economical to manufacture and simple to use. Neither the printed circuit board nor the connector have to be modified such as notching out of the printed circuit board to accommodate the retaining latch. This feature is most important to this invention because very little or no surface area on the PCB is used when locking the latch into fixed locking position. This maximizes board space on the PCB.

An embodiment of this invention comprises a retaining latch having a resilient unitary member having a first portion engaging a connector and a second portion engaging the edge of the printed circuit board and with both portions being elongated on an intermediate resilient portion integrally joining the first and second portions respectively, and a release tab integrally formed with the second portion of the latch and extending therefrom away from the remote edge of the printed circuit board.

In general, this invention relates to a printed circuit board retaining latch for securing a printed circuit board to a connector. The latch has one end which clamps or fastens to a connector and a second end which latches over the edge of a printed circuit board. The two ends of the retaining latch are connected by a spring-like, flexible joining member which allows for a snug fit, as well as ease of opening and closing the latch. A tab on the latch facilitates opening the retainer and removal of the PCB. The tab can be used to close the retainer; however, the retainer can be more conveniently closed by simply pressing on a point over the PCB retainer.

In operation, the printed circuit board is inserted into a connector, after which the connector is inserted into a connector retainer at the end of the retaining latch. Lastly, the printed circuit board retainer at the other end of the latch is pushed down over the edge of the printed circuit board locking in place the connector and the printed circuit board.

To remove the printed circuit board simply lift the release tab attached to the retainer and the printed circuit board is free to be removed and/or replaced.

Because the retaining latch of this invention is simple to remove and simple to reinstall, field changing of PCB's is greatly facilitated. All the technician has to do is release the latch, remove the printed circuit board, insert a new board, and reset the latch. In addition, it is quite evident that the latch does not have to be attached at any given point along the connector and edge of the PCB, thus there is latitude for attachment. Further, it is evident that the PCB and connector can be connected to other electronic components.

BRIEF DESCRIPTION OF THE DRAWINGS

FIG. 2 is a perspective view of the printed circuit board inserted into the connector with the release tab being raised to remove the printed circuit board retainer from the edge of the printed circuit board. The arrow shows the direction which the tab is lifted to release the latch.

FIG. 4 is a side elevational view showing an unplugged connector and printed circuit board, with part of the printed circuit board being cut away and the arrow showing the direction for insertion of the printed circuit board into the connector.

FIG. 5 is a side elevational view, showing the latch in the open position prior to insertion around the printed circuit board and the connector, with the arrows showing the direction that the retaining latch will take to secure the printed circuit board and connector, the arrows showing the three main areas in which the latch secures to the printed circuit board and connector.

GENERAL DESCRIPTION OF THE PREFERRED EMBODIMENT

Figure 1:
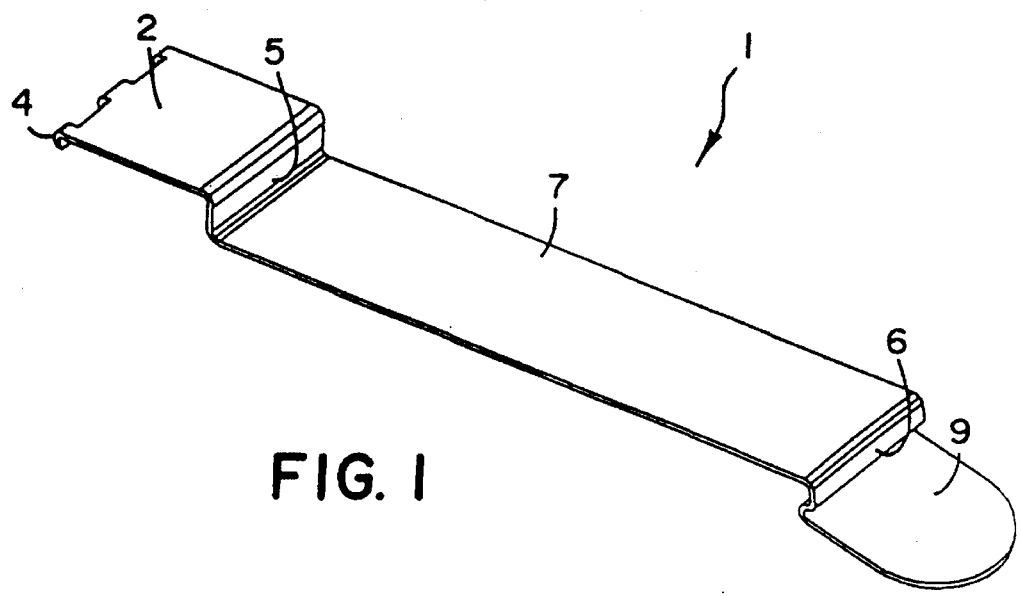
FIG. 1 is a perspective view of the retaining latch.

With reference to FIG. 1 there is illustrated the printed circuit board retaining latch 1 of this invention which can be made of metal or suitable plastic material and wherein a first end connector retainer 2 clamps on to a connector 3 through two gripping surfaces 4 and 5. The connector retainer 2 is joined to a printed circuit board retainer 6 through flexible joining member 7. The printed circuit board retainer 6 clamps over the edge of the printed circuit board 8. The PCB retainer 6 is attached to a release tab 9 which facilitates the opening and release of the retaining latch 1 from the printed circuit board 8.

Further, with reference to FIG. 2 there is shown the retaining latch 1 being removed from the connector 3 and printed circuit board 8 by manually lifting the release tab 9.

Figure 3:
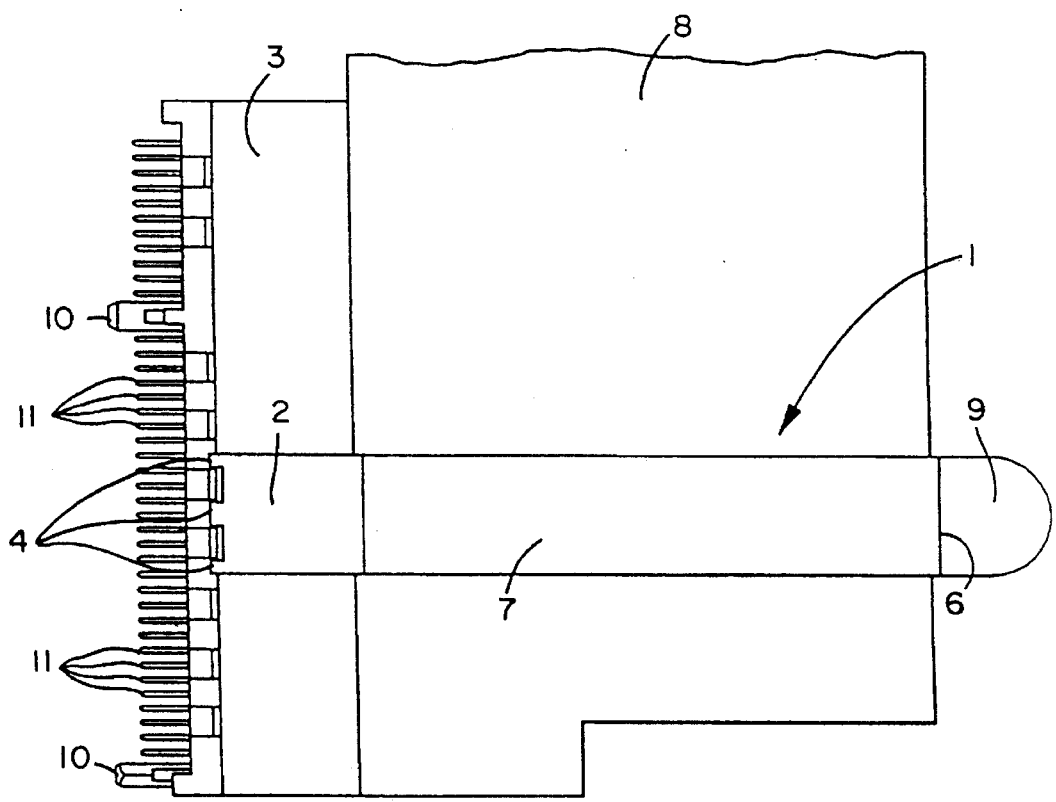
FIG. 3 is a top plan view showing the retaining latch in the locked position and locking in place the printed circuit board and connector, and further showing the pins and guide post on the connector.

Referring to FIG. 3 there is shown the printed circuit retaining latch 1 securing the connector 3. Guide posts 10 and pins 11 on the connector 3 are also shown to identify detail.

Figure 6:
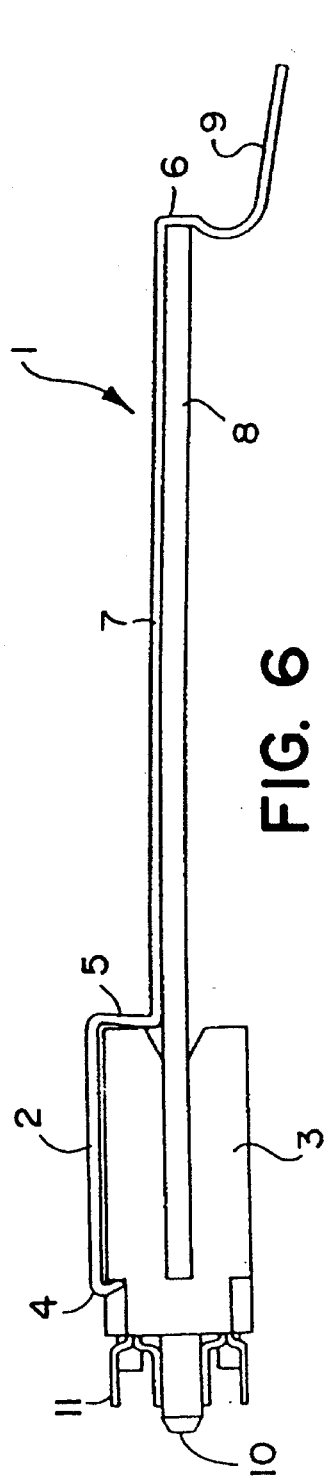
FIG. 6 is a side elevational view, showing the latch closed around the printed circuit board and connector for latching purposes.

With regard to the operation of the latch of this invention, FIGS. 4 through 8 show how the printed circuit board retaining latch 1 is attached to secure the PCB 8 and connector 3. First, FIG. 4 shows the printed circuit board 8 being inserted into the connector 3 with the arrow showing the direction in which the board 8 is inserted. As shown by FIG. 5 after the printed circuit board 8 is inserted the latch 1 is attached to connector 3 through gripping surfaces 4 and 5 and the printed circuit board retainer 6 is manually affixed to the printed circuit board 8 by pressing down on the PCB retainer 6. The arrows show the direction that the latch takes in securing the connector 3 and printed circuit board 8. Fully secured, FIG. 6 shows the connector 3 and printed circuit board 8 locked in the retaining latch 1. Further the manner in which the gripping surfaces 4 and 5 on the connector retainer 2 grip the connector 3 is shown, as well as, the manner in which the printed circuit board 8 retainer 6 attaches to the printed circuit board 8.

Figure 7:
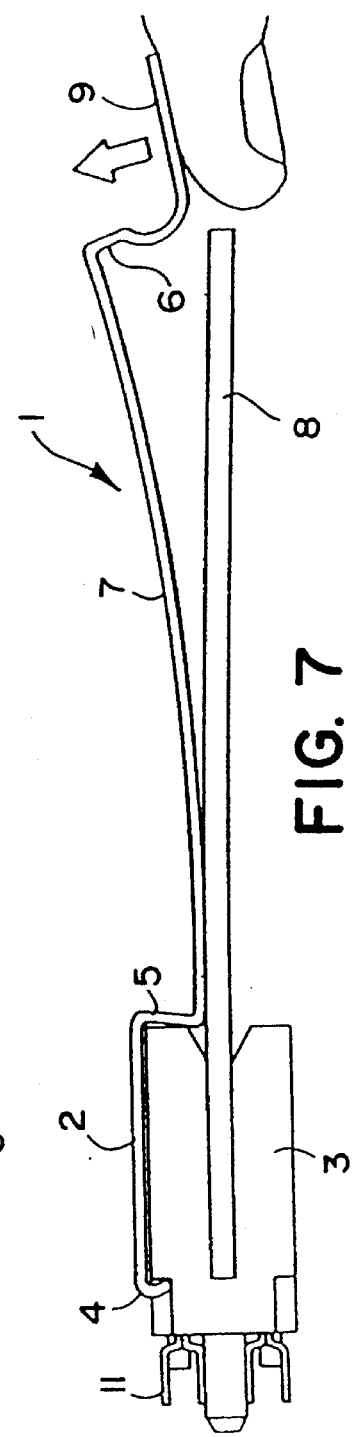
FIG. 7 is a side elevational view of the latch being removed from the printed circuit board and connector with the arrow showing the direction in which the tab is raised to facilitate removal.
Figure 8:
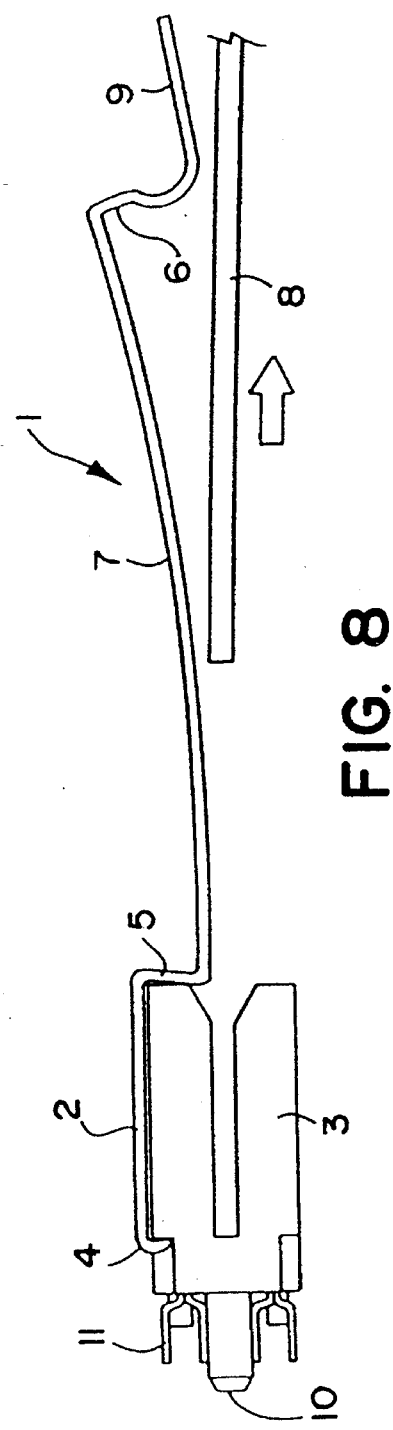
FIG. 8 is a side elevational view, showing the tab of the latch raised and the printed circuit board being removed from the connector with the connector end of the latch shown fixed to the connector; the printed circuit board is shown cut away, and the arrow shows the direction of movement of the PCB.

To remove the printed circuit retaining latch 1, release tab 9 is raised in the direction of the arrow as shown by FIG. 7. Note that because of the snugness of fit the connector retainer 2 remains attached to the connector 3. Finally with regard to disengaging the PCB 8 for replacement, FIG. 8 shows the latch 1 disengaged from the printed circuit board 8 with the printed circuit board 8 being removed. Thus the replacement of the printed circuit board 8 with a new one is facilitated.

As herein shown the end of the retaining latch which clamps to the connector 3 has finger-like grippers 4 which mesh into notches on the connector 3. It is obvious that the end of the retaining latch which clamps the connector can be shaped to fit the contour of the connector. For example, if the edge of the connector is straight the gripping edge will also be straight.

In another embodiment of this invention the printed circuit retaining latch can be permanently attached to the connector.

Further note that in another embodiment the printed circuit board retaining latch can be applied to the opposite side of the joined PCB and connector.

The printed circuit board retaining latch of this invention is made of metal coated with an insulating coating; however, depending on use a non-insulated retaining latch can be employed. Of course, the PCB latch of this invention can be fabricated from plastic which would be non-conductive.

Obviously, many modifications may be made without departing from the basic spirit of the present invention. Accordingly, it will be appreciated by those skilled in the art that within the scope of the appended claims, the invention may be practiced other than has been specifically described herein.

What is claimed is:

1. A printed circuit board retaining latch for securely locking in place a printed circuit board plugged into a card edge connector, said retaining latch comprising a single flexible unitary member including a first end connector retainer which clamps onto the connector, said connector retainer being joined to a printed circuit board retainer through a flexible joining member, with said printed circuit board retainer being attached to a tab which facilitates the removal of the printed circuit board from its retainer, said retaining latch not requiring modification of either the printed circuit board or connector.

2. The retaining latch of claim 1, wherein the first end connector retainer secures the connector so snugly as to remain fixed to the connector when the printed circuit board is removed.

3. The retaining latch of claim 1, wherein the connector retainer is permanently attached to the connector.

4. The retaining latch of claim 1, wherein the first end of the connector retainer has gripping hooks which mesh into notches on the connector.

5. The retaining latch of claim 1, wherein the first end of the connector retainer is straight to fit a straight surface on the connector.

6. The retaining latch of claim 1, wherein the printed circuit board has an edge remote from the connector, and the printed circuit board retainer latches just enough of the circuit board for securely locking in place said printed circuit board into said card edge connector.

7. The retaining latch of claim 1, wherein the tab at the retainer end is able to open the retainer by a minimal amount of force.

8. The retaining latch of claim 1, wherein the retaining latch is made of metal and coated with an insulating coating.

9. The retaining latch of claim 1 fitted onto a connector and a circuit board to secure said connector and circuit board in a locked position.

10. A retaining latch for securing in place a printed circuit board received in a connector wherein the printed circuit board has an edge remote from the connector comprising a resilient unitary member having a first portion engaging the connector and a second portion engaging the edge of the printed circuit board, said first portion and said second portion elongated on an intermediate resilient portion integrally joining said first portion and said second portion, respectively, and a release tab integrally formed with said second portion of said retaining latch and extending therefrom away from the remote edge of said printed circuit board, said retaining latch not requiring modification of either the printed circuit board or connector.

11. A method of retaining a printed circuit board securely in a connector employing the retaining latch of claim 1 comprising the steps of inserting said printed circuit board into said connector, inserting said connector into said first end connector retainer, opening said retaining latch by putting force on said flexible joining member, inserting the open printed circuit board retainer onto the printed circuit board by a downward force on said printed circuit board retainer thereby securing said connector and said printed circuit board.

* * * * *